United States Patent [19]
Joosten et al.

[11] Patent Number: 5,313,158
[45] Date of Patent: May 17, 1994

[54] TEST SYSTEM INTEGRATED ON A SUBSTRATE AND A METHOD FOR USING SUCH A TEST SYSTEM

[75] Inventors: Johannes J. M. Joosten; Cornelis L. M. van der Klauw, both of Eindhoven, Netherlands

[73] Assignee: U.S. Philips Corporation, New York, N.Y.

[21] Appl. No.: 4,477

[22] Filed: Jan. 12, 1993

Related U.S. Application Data

[63] Continuation of Ser. No. 619,275, Nov. 28, 1990, abandoned.

[30] Foreign Application Priority Data

Dec. 1, 1989 [NL] Netherlands .................... 8902964

[51] Int. Cl.$^5$ .................... G06F 11/00; G01R 31/28
[52] U.S. Cl. .................... 324/158 R; 324/73.1
[58] Field of Search .............. 324/73.1, 158 R, 158 T; 371/22.3, 22.5, 22.6, 15.1; 357/75; 437/8; 307/303, 303.1; 257/40, 48; 340/825.22

[56] References Cited

U.S. PATENT DOCUMENTS

| | | | |
|---|---|---|---|
| 3,465,427 | 9/1969 | Balderson et al. | 324/158 R |
| 3,466,544 | 9/1969 | Balderson | 324/158 R |
| 4,336,495 | 6/1982 | Hapke | 324/158 R |
| 4,339,710 | 7/1982 | Hapke | 324/158 T |
| 4,684,884 | 8/1987 | Soderlund | 324/158 R |
| 4,697,095 | 9/1987 | Fujii | 307/303 |
| 4,743,841 | 5/1988 | Takeuchi | 324/158 R |
| 4,901,012 | 2/1990 | Gloanec et al. | 324/158 R |
| 4,931,722 | 6/1990 | Stoica | 324/158 R |
| 4,970,454 | 11/1990 | Stambaugh et al. | 326/73.1 |
| 5,012,185 | 4/1991 | Ohfuji | 324/158 R |

OTHER PUBLICATIONS

Nishimura et al.; "Multiplexed Test Structure; A Novel VLSI Technology Development Tool"; IEEE VLSI Workshop on Test Structure; Feb. 17-18, 1986; pp. 336-355.

Primary Examiner—Vinh Nguyen
Attorney, Agent, or Firm—Steven R. Biren

[57] ABSTRACT

Integrated circuits are arranged in a regular pattern on a semiconductor wafer. The circuits are separated from one another by kerf areas. These kerf areas are used to accommodate test structures from which process parameters can be derived. Because the surface area of these kerf areas is comparatively small, it is necessary to minimize the number of bonding pads or connection terminals for these test structures. The test system is extended with a multiplex circuit whereby a test structure can be selected from the test system and which connects one of the various test structures to always the same connection terminals. Furthermore, using one stimulus which is applied to a connection terminal and which is also the stimulus for the test structure whose response is to be measured, the desired test structure is selected. This is because the multiplex circuit detects on which connection point the stimulus is received and decodes the test structure to be connected to the connection terminals on the basis of the connection pin number.

6 Claims, 2 Drawing Sheets

TEST SYSTEM INTEGRATED ON A SUBSTRATE AND A METHOD FOR USING SUCH A TEST SYSTEM

This is a continuation of application Ser. No. 07/619,275, filed Nov. 28, 1990, now abandoned.

BACKGROUND OF THE INVENTION

The invention relates to a test system integrated on a substrate for the measurement and/or testing of parameters of test structures, an arbitrary one of the various test structures being connectable to the same externally accessible connection terminals by means of a multiplex circuit. The invention also relates to a method for using such a test system.

An integrated test system of this kind is known from a publication of the IEEE VLSI Workshop on Test Structures, held in Long Beach, Calif., Feb. 17 and 18, 1986. This publication by A. Nishimura et al, entitled "Multiplex Test Structure; a Novel VLSI Technology Development Tool", describes how the number of connection terminals for the measurement and/or testing of parameters of test structures included in a process control module can be limited. To this end, use is made of a multiplex circuit whereto ten external selection signals are applied, enabling the selection of 1024 different test structures. Using the multiplex circuit, a selected test structure is connected to some further connection terminals whereto supply voltages/stimuli are applied, the response of the test structure to the stimulus presented being measured on other connection terminals. According to said publication the test structures and the multiplex circuit are accommodated in a so-called test chip which is used for the development of new CMOS technology and/or new CMOS circuits. When a technique of this kind is used for monitoring the production process, several process control modules would have to be distributed across the semiconductor wafer to be processed. These process control modules then occupy substrate surface area which can normally be used for producing integrated semiconductor circuits. The foregoing reduces the yield of a silicon wafer. Therefore, it has been proposed (in the magazine Solid-State Technology, May 1985) to abstain from accommodating process control modules in the location of semiconductor circuits to be produced, and to arrange control modules/test circuits in the kerf areas surrounding the semiconductor circuits. Even though it is assumed in the cited publication that the kerf areas have a width of 200 μm, they are much narrower in practice. Therefore, the number of connection terminals of test circuits must be minimized because these connection terminals have comparatively large dimensions of from 80×80 to 125×125 μm².

SUMMARY OF THE INVENTION

It is the object of the invention to minimize the number of connection terminals for a test system integrated on a substrate.

To achieve this, a test system integrated on a substrate in accordance with the invention is characterized in that the multiplex circuit and the test structures are connected to the same connection terminals, a test stimulus on at least one of the connection terminals determining which test structure is connected to the connection terminals. The integrated test system offers the advantage that the connection terminals are used for selecting the test structures as well as for the supply of supply voltages and the output of the signals to be measured. Consequently, test structures can be more readily accommodated in the kerf areas. The foregoing offers the advantage that no surface of the functional silicon is used for the process control modules, and that all necessary process control modules can still be accommodated in the kerf areas.

The invention also relates to a method for measuring and/or testing parameters of test structures in a test system integrated on a substrate, in which a set of externally accessible connection terminals is, upon selection, connectable via switches to any one of the test structures, the selection being effected via selection control circuits referenced by a common reference terminal, each selection control circuit having an input which is fed from the set of connection terminals, each selection control circuit having an output for producing a switch-on voltage or a switch-off voltage dependent on a reference voltage at the common reference terminal, wherein said method comprises a first measurement of a parameter of one test structure with the common reference terminal at a fist voltage and a second measurement of the same parameter of the same test structure with the common reference terminal at a second voltage differing from the first, followed by a comparison of the results of the fist and second measurements, signalling an error if the results differ by more than a predetermined threshold. Especially in circumstances where the threshold voltages of the switches cannot be guaranteed to be sufficiently high this method is useful. Leakage currents through the switches of test structures that are not selected are changed by varying the switch-off voltage via the reference voltage. A substantial change in measurement result therefore indicates the presence of leakage currents, marking the measurement as dubious.

BRIEF DESCRIPTION OF THE DRAWING

The invention will be described in detail hereinafter with reference to embodiments shown in the drawing, in which.

DESCRIPTION OF THE PREFERRED EMBODIMENTS

Figure 1:
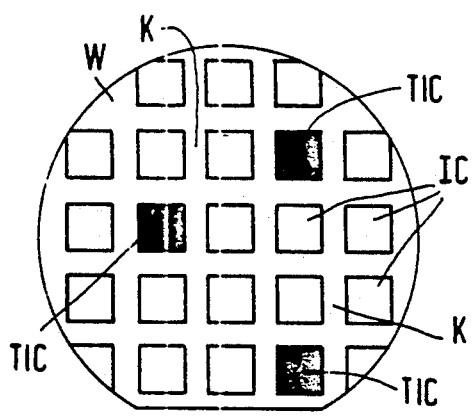
FIG. 1 shows an example of a silicon wafer.

The silicon wafer W shown in FIG. 1 comprises a regular pattern of integrated circuits IC. These circuits IC are separated from one another by kerf areas K. Furthermore, test circuits which are denoted by the reference TIC may be accommodated on the semiconductor wafer W in the regular pattern of integrated circuits IC. Such test circuits TIC were often used to accommodate test structures requiring many connection terminals, such as four-point measurements like Kelvin measurements and van der Pauw measurements. Therefore, it is necessary to limit the number of connection terminals for the test structures. From the cited publication (IEEE VLSI Workshop, Long Beach, Calif.) it is known to combine multiplex circuits with test structures. The number of connection terminals is thus drastically reduced and test structures can be accommodated in the kerf areas between the ICs.

Figure 2:
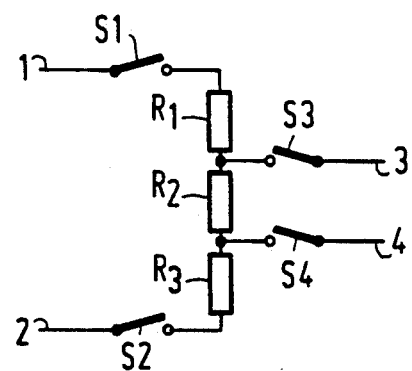
FIG. 2 shows an example of a test structure.

FIG. 2 shows one of the test structures, in this case consisting of three series-connected resistances R1, R2 and R3. A current is passed through or a voltage is impressed on this resistance structure R1, R2 and R3; the current consumed is then measured and the voltage is measured across a selected part of the structure. The resistances R1 and R3 include the parasitic series resistances. Via switches S1, S2, S3 and S4, the test structure is connected to supply terminals 1 and 2 and to test points 3 and 4. The parasitic resistances caused by the switches are also included in the resistances R1 and R3. The switches S1, S2, S3 and S4 are controlled by the multiplex circuit which determines which test structure is connected to the connection terminals 1, 2, 3 and 4. A voltage is impressed on the connection terminals 1 and 2, (the stimulus), while the response of the test structure to said stimulus is measured on the terminals 3 and 4. In accordance with the present state of the art, for example known from IEEE VLSI Workshop on Test Structures, Long Beach, Calif., 1986, separate connection terminals are used for applying the stimuli, the measurement of the response, and the control of the multiplex circuit.

Figure 3A:
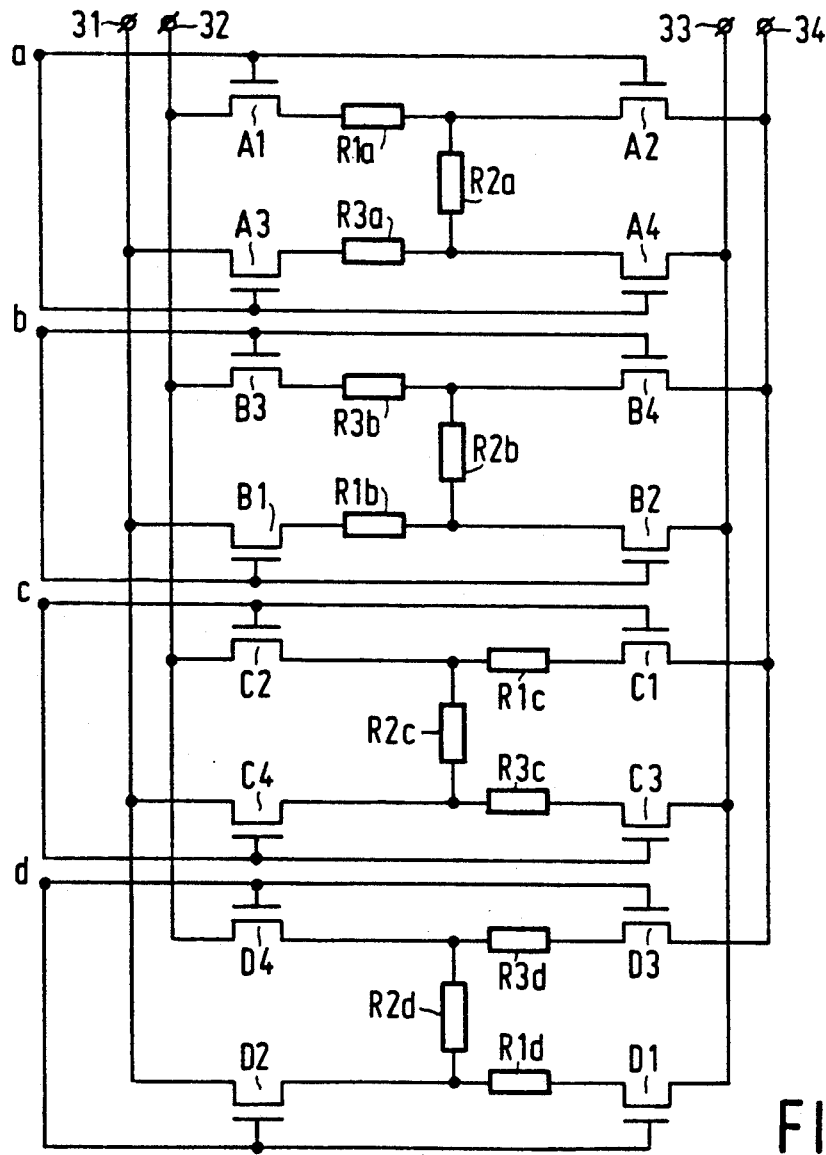
FIGS. 3a and 3b show an embodiment of a self-multiplexing four-point test structure in accordance with the invention.

FIGS. 3a and b show a preferred embodiment of a circuit of a test system in accordance with the invention which is to be integrated on a substrate. In comparison with the state of the art, the number of connection terminals required is drastically reduced. The example of a four-point test structure shown in FIG. 2 comprises four switches S1, S2, S3 and S4 which are simultaneously opened or closed. FIG. 3a shows four of such four-point test structures. In accordance with the state of the art, six connection terminals would be required, i.e. two connection terminals for the stimuli, two connection terminals for measuring the response, and two connection terminals for controlling the multiplex circuit. FIG. 3a shows the four test structures which are denoted as R1a, R2a, R3a; R1b, R2b; R3b, R1c, R2c, R3c; R1d, R2d and R3d. The first test structure R1a, R2a and R3a is connected, by way of four semiconductor switches/MOS-transistors A1, A2, A3 and A4, to the connection terminals 31, 32, 33 and 34 when a sufficiently high control potential is applied to the node a. The four control electrodes of said transistors A1 to A4 are connected to the point a for this purpose. Similarly, the test structure R1b, R2b and R3b is connected to the same output terminals 31, 32, 33 and 34 via four switches/MOS-transistors B1, B2, B3 and B4. The gate electrodes of the transistors B1, B2, B3 and B4 are connected to the point b. It is to be noted that the connections of the test structure R1b, R2b, R3b have been interchanged with respect to the test structure R1a, R2a and R3a on the connection terminals 31 and 32. However, the connection of R2b has not been interchanged with respect to the connection of R2a on the output terminals 33 and 34. Consequently, the polarity of the response of a stimulus to be applied to the terminal 32 instead of to the terminal 31 will be reversed on the terminals 33 and 34. This polarity reversal can be eliminated by interchanging the connections of the output terminals 33 and 34 to the resistance R2b. FIG. 3a shows a third test structure R1c, R2c and R3c which is connected to the connection terminals 31 to 34 by way of four switches/MOS-transistors C1, C2, C3 and C4. The gate electrodes of said transistors C1 to C4 are all connected to the node c. When a voltage of sufficiently high potential is applied to this node c, the switches will connect the test structure R1c, R2c and R3c to the connection terminals 31 to 34. The connection between the test structure and said connection terminals is such that the stimulus should now be applied via the connection terminal 33 and that the response is to be measured on the connection terminals 31 and 32. The fourth test structure shown in FIG. 3a comprises the test resistances R1d, R2d and R3d which are connected to the connection terminals 31 to 34 via four switches/MOS-transistors D1 to D4. This connection is realized so that the stimulus is to be applied to the connection terminal 34 and that the response appears on the connection terminals 31 and 32, the polarity of said response being opposed to that of the response of the test structure R1c, R2c and R3c.

Figure 3B:
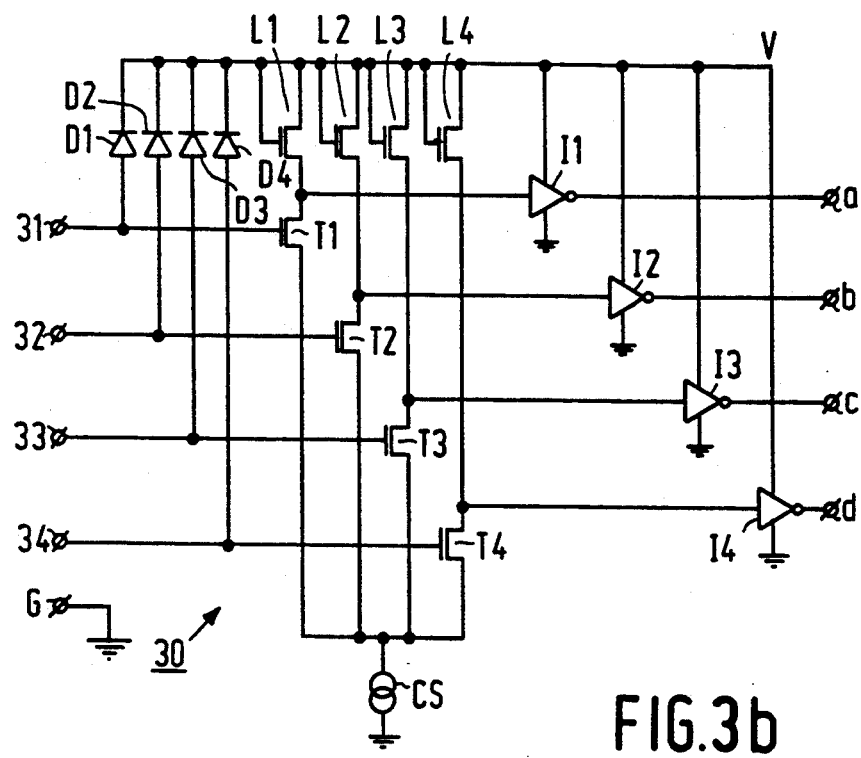

FIG. 3b shows the further portion 30 of the test system in accordance with the invention, said sub-circuit 30 comprising inputs 31 to 34 which are connected to the nodes 31 to 34 of FIG. 3a. Four amplifiers which are composed of, successively, the transistors T1, L1; T2, L2; T3, L3 and T4, L4 are connected to the inputs, the gate electrodes of the transistors T1 to T4 being connected to the inputs 31 to 34, respectively. Each of the transistor pairs T1, L1 to T4, L4 is connected in series between a supply lead V and a current source CS. The other side of the current source CS is connected to a common "ground" terminal G, which, in turn, is connected to the substrate or a special common ground connection terminal. Each of the transistors L1 to L4 is connected as a load. The outputs of the four amplifiers formed by the transistors L1, T1 to L4, T4 are connected to an input of an inverter I1 to I4. These inverters are also fed via the supply lead V and the common terminal G. The outputs of these four inverters I1 to I4 constitute the connection points a, b, c and d, respectively, which control the switches A1 to A4, B1 to B4, C1 to C4, and D1 to D4 of FIG. 3a, respectively. The power supply, via the supply lead V, for the amplifiers formed by the transistor pairs T1 and L1 to T4, L4, and the inverters I1 to I4 is obtained from the stimulus to be applied to one of the four connection terminals 31 to 34. To this end, the inputs 31 to 34 are connected to the supply lead V via diodes D1 to D4. The operation of the circuit shown in FIG. 3b is as follows. When a stimulus is applied to the connection terminal 31, the output node a will become logic high, via the inverters T1, L1 and I1, so that the test structure R1a, R2a and R3a is selected (see FIG. 3a). The other nodes, being the outputs of the inverters I2, I3 and I4, all remain at a low voltage level, determined by the common terminal G, because the voltage applied to the relevant inputs 32 to 34 is not sufficiently high. The voltage divider shown in FIG. 3a and constituting the test structure R1a, R2a and R3a must be proportioned so that the voltages on the nodes 33 and 34 remain sufficiently low and do not exceed the threshold voltages of the amplifier/inverter stages T3, I3 and T4, I4. The voltage on the connection terminal 32 amounts to 0 volts, so that the full stimulus is present across the test structure R1a, R2a and R3a, the switches/transistors A1 to A4 are open, and the response is to be measured on the output terminals 33 and 34. If, at the same time, the voltages on the nodes b, c, d are sufficiently low to keep the switches/transistors B1 to B4, C1 to C4, D1 to D4 closed this response will reflect the properies of only R1a, R2a, R3a. A leakage current through any one of the switches/transistors B1 to B4, C1 to C4, D1 to D4 would affect this measurement. By a proper selection of the threshold voltages of these switches/transistors this can be prevented. In some cases, however, a risk of leakage currents may be unavoidable, for example in case of process constraints upon the threshold voltages, combined with process fluctuations. In these cases, the leakage effect can be detected, or even eliminated, by repeating the measurement with a lower voltage at the common terminal G.

If a stimulus is applied to the connection terminal 33 in a different situation and the terminal 34 is maintained at 0 volts, the output of the inverter I3, being the node c, will become logic high so that the transistors C1 to C4 are turned on (see FIG. 3a). The test structure R1c to R3c is connected to the connection terminals 33 and 34 so that the full stimulus is present across these terminals and the response can be measured on the connection terminals 31 and 32. It will be apparent from the foregoing that in the present embodiment four different test structures can be selected by means of four connection terminals, enabling measurement of the response thereof to a stimulus. According to the cited state of the art, six connection terminals would be required. If 1024 different test structures were to be measured by means of the test structure system in accordance with the invention, twelve connection terminals would be required in accordance with the invention while seventeen connection terminals would be required in accordance with the present state of the art.

Figure 4:
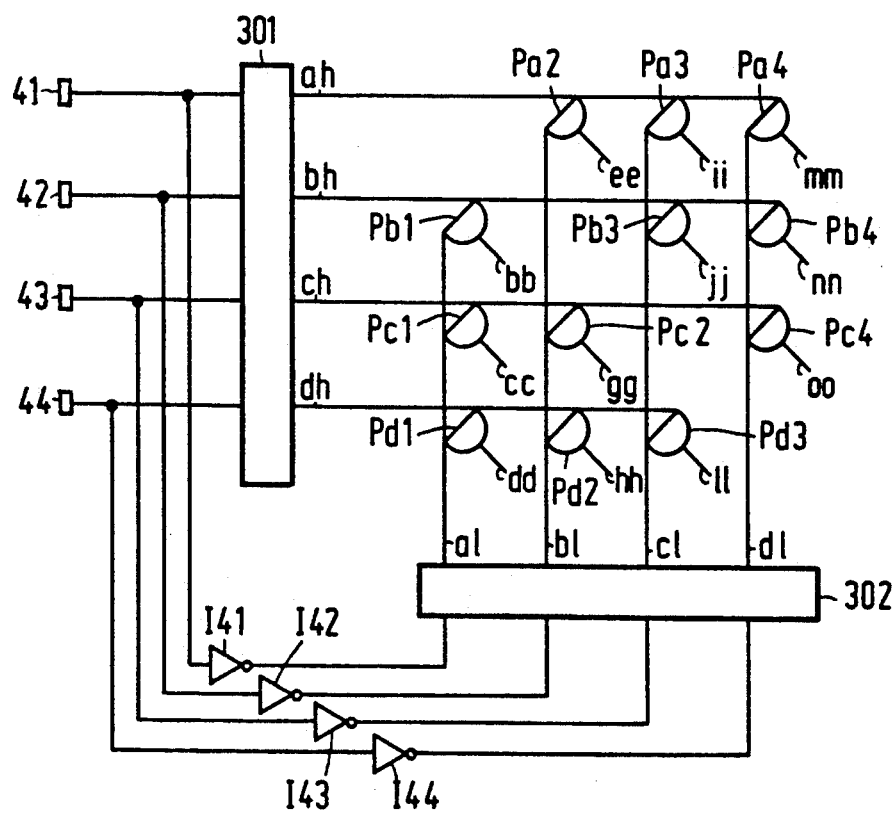
FIG. 4 shows a detail of a further embodiment of a self-multiplexing test structure in accordance with the invention.

FIG. 4 shows a part of a further embodiment of a self-multiplexing test structure in accordance with the invention. The rendered part of the self-multiplexing test structure comprises the electronic circuitry for selecting the test structures on the semiconductor wafer. Using the electronic circuit shown, one of twelve different test structures can be selected, which test structure is connected, by way of switches as shown in FIG. 2, to two supply terminals and two connection terminals for measuring the response. These four connection terminals are numbered 41, 42, 43 and 44 and are shown in FIG. 4. A sub-circuit 301 is connected to the four connection terminals 41 to 44, the sub-circuit 301 having the same configuration as the circuit 30 shown in FIG. 3b. The circuit shown in FIG. 4 also comprises a further sub-circuit 302, four inputs of which are connected, via inverters I41 to I44, to the connection terminals 41 to 44. The sub-circuit 302 may be constructed in the same way as the circuit 30 shown in FIG. 3b, with the exception of the diodes D1 to D4 which are not connected to the outputs of the inverters I41 to I44 but directly to the connection terminals 41 to 44, respectively. The outputs ah, bh, ch and dh of the sub-circuit 301 are connected to the logic gates Pa2 to 4; Pb1, Pb3 to Pb4; Pc1, Pc2 and Pc4; and Pd1 to Pd3, respectively. The outputs al, bl, cl and dl of the sub-circuit 302 are connected to the inputs of the logic gates Pb1, Pc1, Pd1; Pa2, Pc2, Pd2; Pa3, Pb3, Pd3; Pa4, Pb4 and Pc4, respectively.

The operation of the multiplex circuit shown in FIG. 4 is as follows. The logic gates connected to the outputs of the sub-circuits 301 and 302 are logic AND-gates. When a voltage +V is applied to a connection terminal 41, the output ah of the sub-circuit 301 will become logic high. When a signal of 0 V is applied to the connection terminal 44, the output dl of the sub-circuit 301 will also become logic high. This is because the 0 V signal on the connection terminal 44 is converted into a logic high signal on the input of the sub-circuit 302 via the inverter 44. The logic AND-gate Pa4 is connected to the output ah of the circuit 301 as well as to the output dl of the sub-circuit 302. As a result, the output mm of the gate Pa4 becomes logic high. Using the output signal mm of the gate Pa4, one of the twelve test structures is selected by the closing of the switches connected thereto. The switches are constructed so that a first switch connects the test structure to the supply terminal 41, another switch connects the test structure to the 0 V connection terminal 44, and two other switches connect the test structure to the connection terminals 42 and 43 for measuring the response to the stimulus. It is to be noted that, after the switching-on of a test structure by the output mm of the logic gate Pa4, a voltage will arise on the connection terminals 42 and 43 due to the voltage division caused by the series connection of the resistances of the activated test structure. It will be evident that the switch-over voltage of the inverters 41 to 44, wherebelow these converters convert a logic low signal into a logic high level, must be below the voltages produced by the voltage divider on the terminals 42 and 43. When the supply voltage V and the 0 V voltage are applied to other connection terminals, for example 42 and 44, another test structure will be selected, for example the test structure activated by the output signal mm of the logic AND-gate Pb4 in the present example.

The logic AND-gates Pa2 to Pa4; Pb1, Pb3, Pb4; Pc1, Pc2, Pc4; Pd1 to Pd3 can be constructed as a single NMOS-transistor, the drains being connected to the outputs of the sub-circuit 301 while the gates are connected to the outputs of the logic sub-circuit 302. The sources of such transistors are then connected to the gates of the switches shown in FIG. 2b. For deactivation of the switches after completion of a test cycle, it is advantageous to connect the sources of the AND-gate, constructed as a transistor, to a 0-V lead via a load.

The sub-circuits 301 and 302 can also be simplified by omitting the inverters denoted by the references I1 to I4 in FIG. 3b. However, in that case the logic AND-gates shown in FIG. 4 must be replaced by logic NOR-gates. In the latter case fewer components are required, which is of course an advantage.

We claim:

1. A test system integrated on a substrate, for at least one of measuring and testing of parameters of respective test structures, the system having externally-accessible connection terminals coupled to the respective test structures via respective switches, for passing a test stimulus from the connection terminals to stimulate a selectable one of the test structures, the system comprising a multiplex circuit having amplifiers having the inputs coupled to said connection terminals and their outputs coupled for controlling closing and opening of the respective switches, the connection terminals being connected concurrently both to the respective test structures and to input terminals of the multiplex circuit for directing the multiplex circuit in controlling closing and opening of the respective switches, and the test stimulus on the connection terminals serving to select one of the test structures.

2. A test system integrated on a substrate as claimed in claim 1, characterized in that the multiplex circuit comprises a first and a second sub-circuit, each of which comprises a plurality of amplifiers, the amplifiers of the first circuit being connected to different connection terminals, the amplifiers of the second sub-circuit being coupled to different connection terminals each via a respective associated inverter, a combination of each output of the amplifiers of the first sub-circuit and each output of the amplifiers of the second sub-circuit, with the exception of the combination of outputs of the amplifiers of the sub-circuits coupled to the same connection terminal, being coupled to a logic gate whose inputs are connected to the relevant outputs of the amplifiers, an output of each said logic gate controlling a respective group of switches of a test structure for the selection and connection thereof to the connection terminals.

3. A test system integrated on a substrate as claimed in claim 2, characterized in that each of the amplifiers comprises two series-connected inverters, each said logic gate being an AND-gate.

4. A test system integrated on a substrate as claimed in claim 1, characterized in that the amplifiers each comprise two series-connected inverters.

5. A test system integrated on a substrate as claimed in claim 1, characterized in that the amplifiers are fed via a voltage lead which is connected to each connection terminal of the test system via diodes, the diodes all being connected in the same sense.

6. A substrate in the form of a wafer on which several integrated circuits are provided in a regular pattern, said integrated circuits being separated from one another by kerf areas, characterized in that at least one integrated test system as claimed in claim 1 is provided in the kerf areas on the substrate.

* * * * *